United States Patent [19]

Hsu et al.

[11] Patent Number: 5,395,786
[45] Date of Patent: Mar. 7, 1995

[54] METHOD OF MAKING A DRAM CELL WITH TRENCH CAPACITOR

[75] Inventors: Louis L. Hsu, Fishkill; Sieki Ogura; Joseph F. Shepard, both of Hopewell Junction, all of N.Y.

[73] Assignee: International Business Machines Corporation, Armonk, N.Y.

[21] Appl. No.: 269,852

[22] Filed: Jun. 30, 1994

[51] Int. Cl.$^6$ ............................................. H01L 21/70
[52] U.S. Cl. ........................................ 437/52; 437/47; 437/60; 437/919
[58] Field of Search ....................... 437/47, 48, 52, 60, 437/203, 919; 156/644; 257/301

[56] References Cited

U.S. PATENT DOCUMENTS

| 4,663,832 | 5/1987 | Jamotlcar | 156/644 |
| 4,999,312 | 3/1991 | Yoom | 437/60 |
| 5,330,926 | 7/1994 | Sato | 437/52 |

Primary Examiner—Tom Thomas

[57] ABSTRACT

A DRAM cell of the trench capacitor type is formed by a simplified process that reduces cost and increases process latitude by forming the trench collar in a single step of expanding a shallow trench horizontally and conformally coating the collar; etching the trench to its final depth and implanting the bottom heavily and doping the walls lightly; recessing the poly liner in a noncritical step that exposes a contact area between the top of the poly and the adjacent transistor electrode.

13 Claims, 3 Drawing Sheets

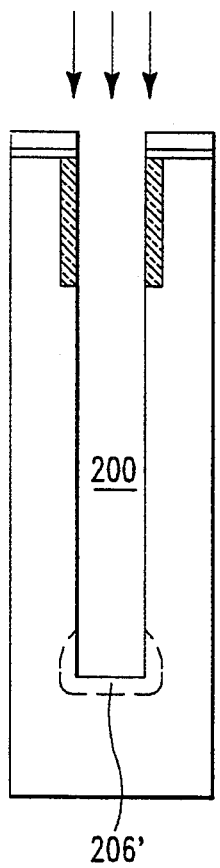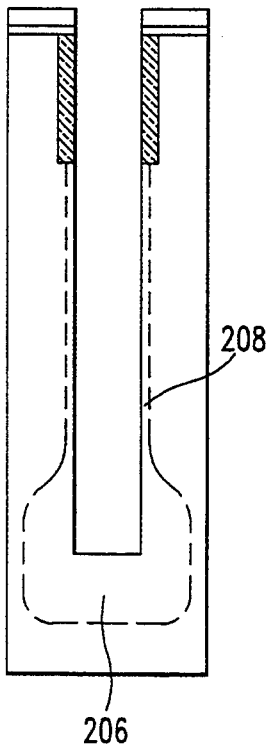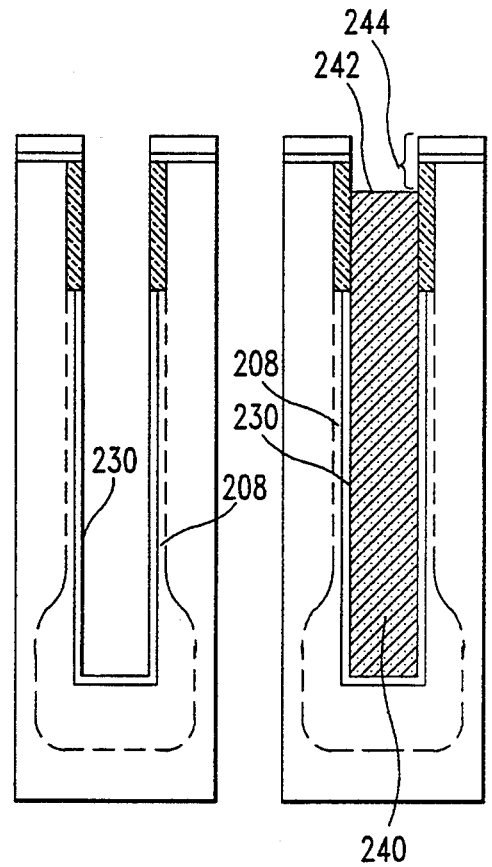
FIG. 6   FIG. 7   FIG. 8   FIG. 9
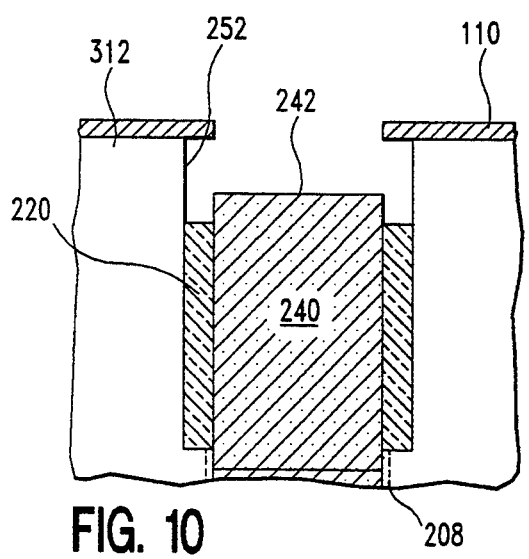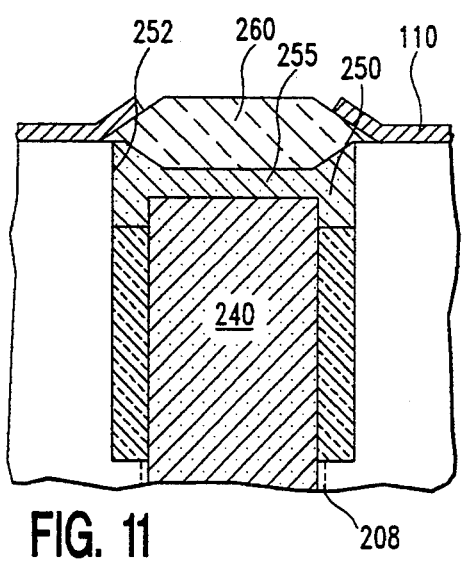
FIG. 10   FIG. 11

METHOD OF MAKING A DRAM CELL WITH TRENCH CAPACITOR

TECHNICAL FIELD

The field of the invention is that of DRAMs having trench capacitors.

BACKGROUND ART

A well-known type of DRAM employs a deep trench capacitor as shown in "A 0.6 $\mu m^2$ 256 Mb Trench DRAM Cell With Self-Aligned BuriEd STrap (BEST)" by L. Nesbit, et al in Technical Digest of the International Electron Devices Meeting, Washington D.C. p. 627, 1993.

Deep trench capacitors in the prior art suffer from a number of problems—including complicated process steps that result in a narrow process window, high stress in the adjacent pass transistor, resulting in leakage due to crystal defects, and a high contact resistance interconnecting diffused region between the capacitor and the device.

Conventional deep trench capacitors are made by a process that employs three etch steps on the capacitor polysilicon fill and two collar steps to isolate the buried capacitor plate and to provide a strap connection to bridge the collar at the top of the capacitor and connect to the pass transistor. The process window is very small and high stress and high contact resistance can be caused by an improper recess etch step on the poly liner. Incomplete removal of the films in the recess area will prevent a good storage node contact. During oxidation steps, oxide growing into the seam of the poly trench fill causes stress in the surrounding areas.

SUMMARY OF INVENTION

The invention relates to a trench capacitor DRAM cell in which a simplified trench process reduces cost and increases process latitude by forming the trench collar in a single step of expanding a shallow trench horizontally and forming an oxide collar; etching the trench to its final depth and implanting the bottom heavily and doping the walls lightly; and recessing the poly liner in a non-critical step that exposes a contact area between the top of the poly and the adjacent transistor electrode.

BRIEF DESCRIPTION OF THE DRAWINGS

FIGS. 6–9 show the full trench, illustrating the doping of the lower portion.

FIGS. 10 and 11 illustrate the formation of contact between the trench inner electrode and the adjacent area.

BEST MODE OF CARRYING OUT THE INVENTION

Figure 3:
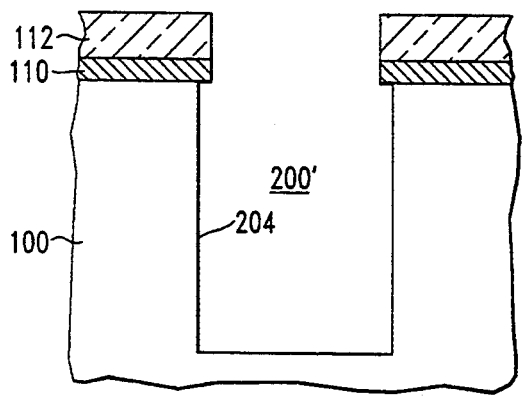

Referring now to FIGS. 1–5, there is shown an initial sequence of the inventive process, in which P-type silicon layer 100 having crystal orientation <100> has a conventional ONO (oxide-nitride-oxide) layer 110 deposited on it with a layer of TEOS (tetra-ethyl-orthosilicate) on the top. An upper trench 200' is etched by a conventional directional etch process such as reactive ion etching (RIE) using, for example $CF_2Cl_2$—$O_2$ to a first depth of illustratively about 1 $\mu m$, exposing upper trench sidewalls 202. This depth is not critical and may be chosen for convenience. Sidewalls 202 are recessed and trench 200' is expanded horizontally by an isotropic etch such as a conventional wet etch or plasma etch by a distance (about 20 nm) suitable to allow growth of a collar dielectric, illustratively about 40 nm of oxide as shown in FIG. 3, thereby forming trench collar sidewalls 204.

The collar dielectric is formed by first growing a layer of thermal oxide 220 (referred to as a collar dielectric) to any convenient thickness such as 40 nm. Note that recessing walls 202 by an isotropic etch ensures that sidewalls 204 are displaced outwardly from the trench aperture so that the top corners of the collar to be formed are protected by the layers 110 and 112 during the RIE processes to follow, so that the dimension of the deep trench to be etched later will be set by the dimension of the aperture in layers 110 and 112.

Figure 1:
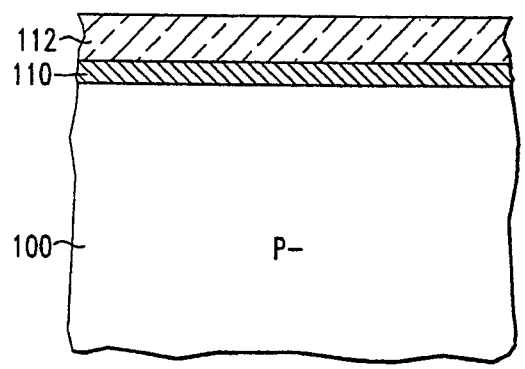
FIGS. 1–5 show in cross section a top portion of a trench constructed according to the invention, illustrating initial steps in the process.
Figure 4:
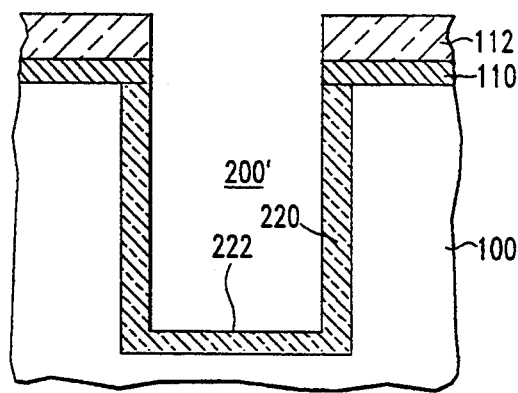
Figure 2:
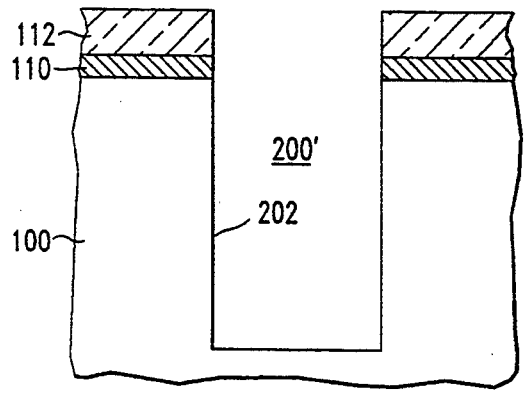
Figure 5:
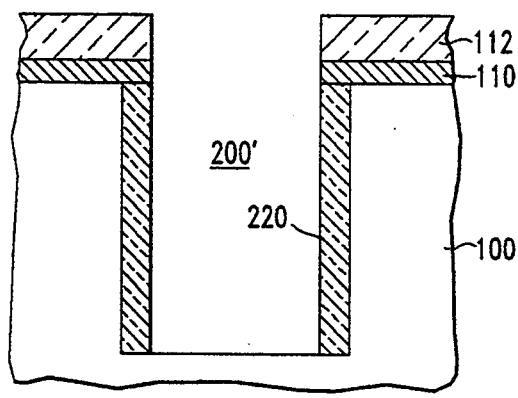

Layer 220 has an unwanted first bottom layer 222 on the bottom of the trench. Bottom layer 222 is removed by a directional etch such as $CF_3$ RIE stopping on silicon. The result of this initial sequence is shown in FIG. 5.

As shown in FIGS. 6–9, the trench is then etched to a final deep trench depth (illustratively about 6 $\mu m$) in a conventional RIE step and in an illustrative embodiment the final trench bottom is implanted with a buried plate dose 206' of a fast-diffusing dopant, e.g. phosphorus, implanted at $1 \times 10^{16}/cm^2$ at 50–70 kEv, to produce a buried N+ plate after diffusion. The depth is not critical and will depend on the amount of charge to be stored, the thickness of the dielectric on the trench walls, etc. The lower trench sidewalls are next doped by one of a number of alternative processes. Illustratively, the trench sidewall is doped with a sidewall dose of arsenic as described in U.S. Pat. No. 5,242,859. The result is shown in FIG. 7, showing the greater extent of diffusion of area 206 compared with area 208. Preferably, the spacing between trenches and the dose in 206' are chosen such that the diffusion areas 206 make contact with one another to form an N+ buried plate. It is necessary that this buried plate extend to make contact with an ohmic connection to a power supply in order to complete the circuit. This outdiffusion of an implanted layer is convenient but not essential and other methods of forming buried plates, such as epitaxial growth, may be used if desired. Preferably, areas 206 are implanted with phosphorous to take advantage of its faster diffusion rate. Then, at convenient intervals such as every 64 cells, an ohmic contact is made between a power bus (illustratively at ground) and the buried plate that is formed by the overlap of diffusions 206. It is an advantageous feature of the invention that the buried plate need not be a very good conductor.

Capacitor trench dielectric 230 (oxide or oxide/nitride) is grown or deposited, illustratively to an equivalent oxide thickness of about 10 nm, as shown in FIG. 8. FIG. 9 shows the trench after deposition of doped polysilicon inner electrode 240, also referred to as the storage node, (with a concentration of about $5 \times 10^{20}/cm^3$ of arsenic or phosphorous) and the recessing of poly 240 to a strap depth indicated by the bracket denoted with numeral 244.

The depth 244 is not critical, as the only requirement relevant to the strap depth is that it be sufficient to form a good contact to the access transistor that will be formed in a conventional later step. Poly 240 is recessed by a conventional wet etch or isotropic dry etch. A second wet etch or isotropic plasma etch removes oxide collar 220 and recesses it a slight amount below the top surface of poly 240 in order to ensure a clean surface 252. Layer 112 has been entirely removed at this point.

As can be seen in FIGS. 10 and 11, the electrode contact surface 242 of poly 240 and vertical strap contact surface 252 of the single-crystal epitaxial layer are the two surfaces to be connected by strap 255. A strap layer 250 of poly is deposited and polished to the same level as layer 110. The top of layer 250 is then oxidized using layer 110 as a mask, leaving strap 255 protected by strap oxide layer 262. This oxidation will also serve to form a conductive path and an ohmic contact with the subsequently formed N+ region of the access device by outdiffusion from layer 240. The oxidation is continued until the "bird's beak" that forms on the edges of oxide 262 extends to the edges of layer 250 in order to protect and insulate the entire layer after protective layer 110 is stripped. There is thus a relationship between the thickness of the collar dielectric, the amount of horizontal etch and the thickness of layer 250. The amount of horizontal etch should not be so great that layer 250 is exhausted in order to get a bird's beak that reaches out to the edge of the offset distance. The depth of strap 255 is not critical, in contrast to the cited prior art DRAM cell that requires a timed RIE step to maintain a critical strap thickness.

After the oxidation step shown in FIG. 11, shallow trench isolation 160 is formed and the access transistor and subsequent interconnections are formed in a conventional manner as illustrated in the Nesbit et al article or as illustrated in U.S. Pat. No. 5,242,859.

Figure 13:
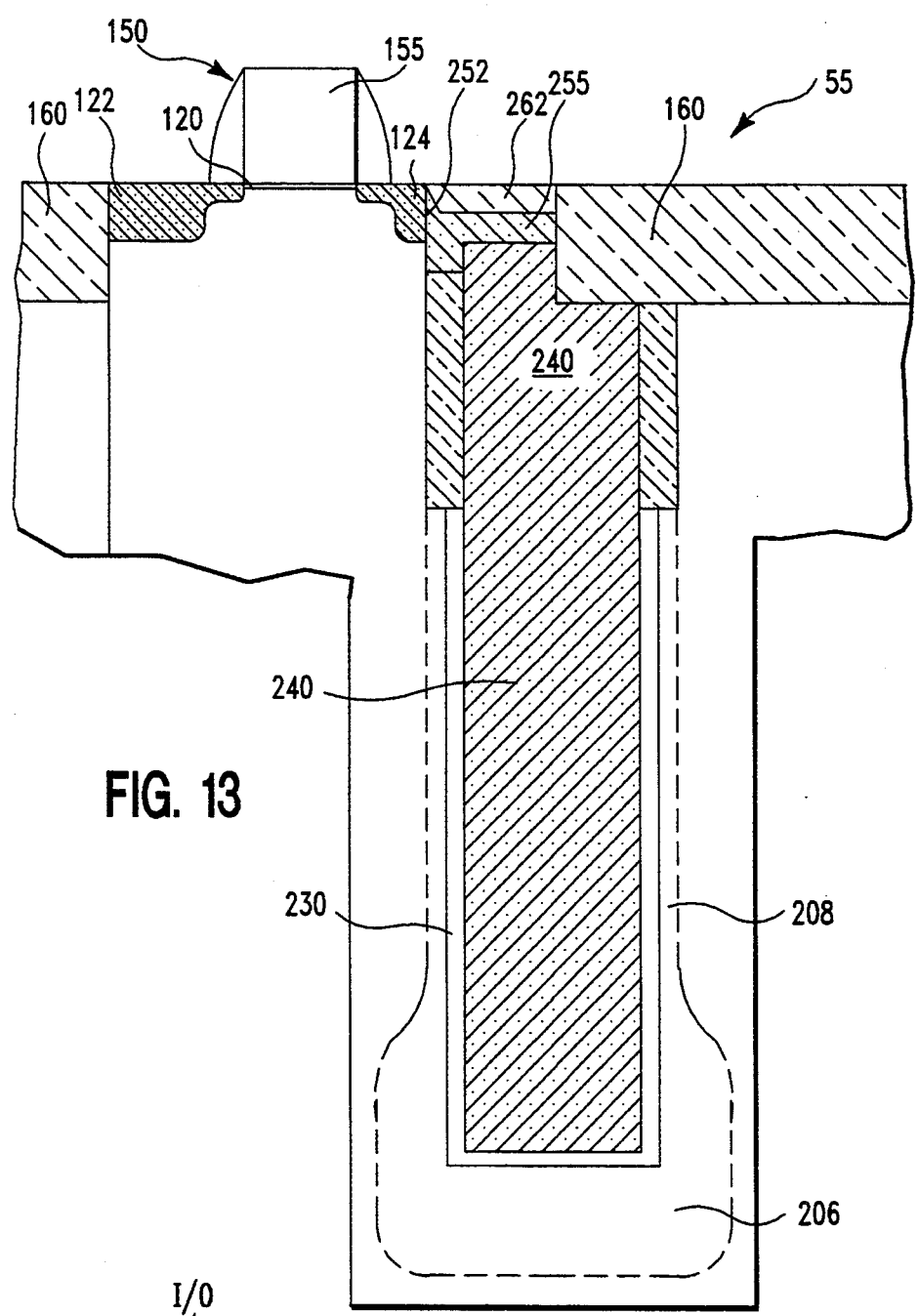
FIG. 13 illustrates a cell in FIG. 12 in more detail.
Figure 12:
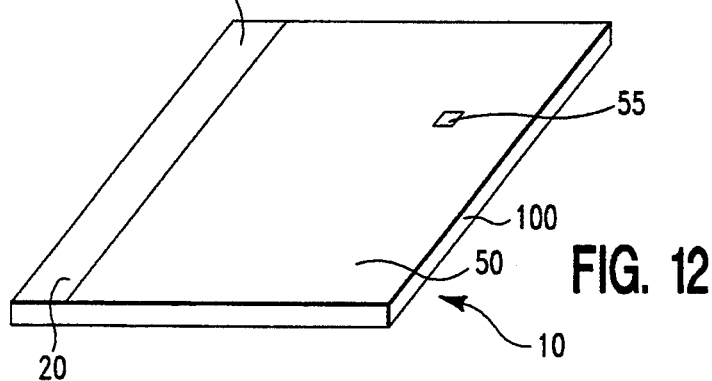
FIG. 12 illustrates in partially pictorial, partially schematic form, a perspective view of a DRAM chip including a cross section of a DRAM cell.

FIGS. 12 and 13 illustrate in partially schematic, partially pictorial form a perspective view of an integrated circuit DRAM 10 having an I/O section 20 and a memory array 50 containing the illustrated cell 55 which is shown in more detail in FIG. 13. Cell 55 contains the trench described above, connected to an access transistor 150 having gate 155, gate oxide 120 and sidewall spacers 190, source 122 and drain 124. The cell is isolated by an oxide-filled shallow trench 160 that leaves a portion of poly 250 to form a buried connecting strap with drain 124. Trench 160 is etched to a depth greater than strap layer 250, illustratively ~0.5 μm, so that inner electrode 240 is in contact only with the access transistor. The bit lines, word lines and contacts are not shown for simplicity in the drawing and various arrangements well known to those skilled in the art may be used with the trench illustrated.

Those skilled in the art will readily appreciate that the invention may be practiced in a variety of embodiments. For example, the illustrations have shown N-channel MOS field effect transistors (FETs), but the invention may be practiced with P-channel FETs or with biCMOS technology as well with appropriate changes in the polarity of the dopants. It will also be appreciated that the dimensions are for illustration only and that dimensions will decrease in the future. Similarly, those skilled in the art will readily be able to apply the invention to many other methods of transistor construction, cell structure, isolation and to DRAM architectures. The invention is not meant to be limited to the embodiment shown here, but only by the scope of the claims.

We claim:

1. A method of forming a DRAM cell in a semiconductor substrate of a first polarity, comprising the steps of:

forming a temporary protective layer on the surface of said substrate;

etching a trench vertically to a first depth, exposing upper trench sidewalls and a first trench bottom;

expanding said trench horizontally by substantially isotropic etching of said upper trench sidewalls under said temporary protective layer to form trench collar sidewalls displaced from said upper trench sidewalls by a sidewall offset distance;

forming a layer of collar dielectric having a thickness substantially equal to said sidewall offset distance on said collar sidewalls and on said first trench bottom;

removing said collar dielectric from at least said first trench bottom;

etching said trench further through said first trench bottom to a final trench depth having a final trench bottom and lower trench sidewalls;

doping said lower trench sidewalls with a sidewall dose of said second polarity;

forming a trench dielectric on at least said lower trench sidewalls;

forming an inner electrode within said trench etching said inner electrode and said collar dielectric to a strap depth, thereby exposing a strap contact surface on a portion of said collar sidewalls and an electrode contact surface on the top of said inner electrode;

forming a conductive strap between said strap contact surface and said inner electrode; and forming an access transistor having a strap contact electrode abutting said strap contact surface.

2. A method according to claim 1, in which said step of forming said strap includes a step of oxidizing a top surface of a strap material using an oxide mask to form a strap oxide layer such that the edge of said strap oxide layer extends at least to said upper trench sidewalls.

3. A method according to claim 1, in which said step of forming said strap includes a step of forming a conductive strap layer between said collar sidewalls and further including a step of forming an isolation region isolating said DRAM cell and having an isolation depth above said trench greater than said strap depth, whereby that portion of said conductive strap layer outside said strap is removed.

4. A method according to claim 3, in which said step of forming said isolation region includes a step of etching said conductive strap layer and said substrate to form an isolation trench and a step of filling said isolation trench with a dielectric.

5. A method according to claim 3, in which said step of forming said isolation region includes a step of oxidizing said conductive strap material and said substrate.

6. A method according to claim 2, in which said step of forming said strap includes a step of forming a conductive strap layer between said collar sidewalls and further including a step of forming an isolation region isolating said DRAM cell and having an isolation depth above said trench greater than said strap depth, whereby that portion of said conductive strap layer outside said strap is removed.

7. A method according to claim 6, in which said step of forming said isolation region includes a step of etching said conductive strap layer and said substrate to form an isolation trench and a step of filling said isolation trench with a dielectric.

8. A method according to claim 6, in which said step of forming said isolation region includes a step of oxidizing said conductive strap material and said substrate.

9. A method according to claim 1, further including a step of implanting a buried plate dose of a second polarity opposite said first polarity and a plate magnitude in said final trench bottom and subsequently diffusing said buried plate dose to form a buried plate.

10. A method according to claim 9, in which said step of forming said strap includes a step of oxidizing a top surface of a strap material using an oxide mask to form a strap oxide layer such that the edge of said strap oxide layer extends at least to said upper trench sidewalls.

11. A method according to claim 9, in which said step of forming said strap includes a step of forming a conductive strap layer between said collar sidewalls and further including a step of forming an isolation region isolating said DRAM cell and having an isolation depth above said trench greater than said strap depth, whereby that portion of said conductive strap layer outside said strap is removed.

12. A method according to claim 11, in which said step of forming said isolation region includes a step of etching said conductive strap layer and said substrate to form an isolation trench and a step of filling said isolation trench with a dielectric.

13. A method according to claim 11, in which said step of forming said isolation region includes a step of oxidizing said conductive strap material and said substrate.

* * * * *